(12) United States Patent
Pfaffinger et al.

(10) Patent No.: US 10,117,370 B2
(45) Date of Patent: Oct. 30, 2018

(54) METHOD FOR POPULATING CIRCUIT BOARDS BY EQUIPMENT ON A POPULATING LINE

(71) Applicant: SIEMENS AKTIENGESELLSCHAFT, München (DE)

(72) Inventors: Alexander Pfaffinger, München (DE); Christian Royer, Ottobrunn (DE)

(73) Assignee: Siemens Aktiengesellschaft, München (DE)

( * ) Notice: Subject to any disclaimer, the term of this patent is extended or adjusted under 35 U.S.C. 154(b) by 262 days.

(21) Appl. No.: 14/442,021

(22) PCT Filed: Sep. 16, 2013

(86) PCT No.: PCT/EP2013/069101
§ 371 (c)(1),
(2) Date: May 11, 2015

(87) PCT Pub. No.: WO2014/075831
PCT Pub. Date: May 22, 2014

(65) Prior Publication Data
US 2015/0296671 A1 Oct. 15, 2015

(30) Foreign Application Priority Data
Nov. 15, 2012 (DE) .......... 10 2012 220 904

(51) Int. Cl.
*H05K 13/08* (2006.01)
*G06Q 10/10* (2012.01)

(52) U.S. Cl.
CPC ........... *H05K 13/08* (2013.01); *G06Q 10/103* (2013.01)

(58) Field of Classification Search
CPC .............. B06B 1/0292; H05K 13/0015; H05K 13/046; H05K 2201/10151; H05K 2201/10734; H05K 2203/167
See application file for complete search history.

(56) References Cited

U.S. PATENT DOCUMENTS 6,983,532 B2 * 1/2006 White .................... H05K 13/04
29/33 P
7,032,304 B2 * 4/2006 Gieskes ............. H05K 13/0452
198/465.1

(Continued)

FOREIGN PATENT DOCUMENTS

DE 19834620 A1 3/1999
DE 102012211810 A1 2/2014
WO WO2010105876 A1 9/2010

OTHER PUBLICATIONS

German Office action for related German Application No. 10 2012 220 904.2, dated Oct. 31, 2015, with English Translation.

(Continued)

*Primary Examiner* — Minh Trinh
(74) *Attorney, Agent, or Firm* — Lempia Summerfield Katz LLC (57) ABSTRACT

A method for populating circuit boards by equipment on a populating line. The method includes acts of providing the equipment comprising a number of component types sufficient to populate a setup family of circuit board types assigned to the equipment, acquiring a number of the circuit board types with assigned circuit boards configured to be populated on the populating line within the planning horizon, assigning the circuit board types to the fixed equipment setup family, determining an assignment quality from a number of orders during a planning interval, optimizing the assignment of the circuit board types to the fixed equipment setup family by a mixed integer programming until the (Continued)

assignment quality exceeds a predetermined amount, and populating the circuit boards on the populating line with the components from the plurality of shuttle tables by at least one populating robot.

11 Claims, 3 Drawing Sheets

(56) References Cited

U.S. PATENT DOCUMENTS

| | | | |
|---|---|---|---|
| 8,051,555 B2* | 11/2011 | Kim | H01L 24/81 |
| | | | 228/180.5 |
| 8,498,730 B2* | 7/2013 | Henry | G05B 19/41865 |
| | | | 206/232 |
| 8,793,008 B2* | 7/2014 | Bauer | H05K 13/08 |
| | | | 700/111 |
| 2007/0204086 A1* | 8/2007 | Jaroszewski | H05K 13/08 |
| | | | 710/262 |
| 2014/0012992 A1* | 1/2014 | Koka | H04L 47/70 |
| | | | 709/226 |
| 2015/0135505 A1 | 5/2015 | Royer | |

OTHER PUBLICATIONS

Amtsblatt Nov. 2007; Mitteilung des Europäischen Patentamts vom 01. Okt. 2007 über Geschäftsmethoden; vol. 30; No. 11; pp. 592-593; ISSN: 0170-9291; XP007905525; Nov. 1, 2007.

PCT International Search Report and Written Opinion of the International Searching Authority dated Feb. 11, 2015 for corresponding PCT/EP2013/069101.

PCT International Search Report and Written Opinion of the International Searching Authority dated Jan. 28, 2014 for corresponding PCT/EP2013/069101.

* cited by examiner

FIG 1

METHOD FOR POPULATING CIRCUIT BOARDS BY EQUIPMENT ON A POPULATING LINE

CROSS-REFERENCE TO RELATED APPLICATIONS

The present patent document is a § 371 nationalization of PCT Application Serial Number PCT/EP2013/069101, filed Sep. 16, 2013, designating the United States, which is hereby incorporated by reference, and this patent document also claims the benefit of DE 10 2012 220 904.2, filed on Nov. 15, 2012, which is also hereby incorporated by reference.

TECHNICAL FIELD

The present embodiments relate to populating circuit boards by a populating line. In particular, the embodiments relate to the formation of one or more fixed equipment setup families.

BACKGROUND

A populating line is configured for populating a circuit board with a number of components. In this case, a differentiation may be made between variant manufacturing and fixed equipment manufacturing.

In variant manufacturing, for a short planning horizon (approximately 1-5 days), the circuit boards to be manufactured are divided into setup families ("clusters"). A setup family is, in this case, a set of circuit boards producible with a predetermined number of components on the populating line. The set of the component types required for this purpose is called the equipment and may be accommodated in a set of shuttle tables. A shuttle table may be equipped with the matching components in the preliminary setup for production and stripped again thereafter.

In fixed equipment manufacturing, the equipment for the assemblies to be manufactured is permanently equipped for longer periods (approximately 6-12 months) on shuttle tables. In the case of multiple items of fixed equipment per populating line, the shuttle tables are exchanged accordingly during the setup family change. The equipping and stripping of shuttle tables is then no longer necessary in daily production.

Manufacturing is frequently also operated in mixed form, wherein a part of the circuit boards is produced in fixed equipment manufacturing and another part is produced in variant manufacturing on the same populating line. Because of the lower expenditure for planning, stock keeping, preliminary setup, and refitting, an effort may be made to increase the proportion of fixed equipment manufacturing and reduce the proportion of variant equipment manufacturing.

SUMMARY AND DESCRIPTION

The scope of the present invention is defined solely by the appended claims and is not affected to any degree by the statements within this summary. The present embodiments may obviate one or more of the drawbacks or limitations in the related art.

The object of the embodiments is to identify circuit boards that may be populated in fixed equipment manufacturing.

A populating line for populating circuit boards with components includes fixed equipment, which includes a number of component types, which remain assigned unchanged during a planning horizon. A method for determining the fixed equipment includes: (1) acquiring a number of circuit board types with assigned circuit boards, which are to be populated on the populating line within the planning horizon; (2) assigning circuit board types to a fixed equipment setup family, wherein all components for populating a circuit board of a circuit board type of the fixed equipment setup family are included by the fixed equipment; and (3) optimizing the assignment until an assignment quality exceeds a predetermined amount.

Variant equipment for a subset of the circuit board types, which are not contained in any fixed equipment setup family, includes all component types that are necessary for populating these circuit board types. Variant equipment is temporarily equipped on shuttle tables and stripped again after the production of the circuit board types. Circuit board types, which are to be produced frequently in the course of an operation of the populating line, may be assigned to the fixed equipment in an improved manner, so that a productivity of the populating line may be increased. In particular, it may be provided that equipment for at least one fixed equipment setup family is attached to the populating line. The number of the circuit board types in the variant manufacturing may be reduced and a setup effort in the preliminary setup region may be reduced. In addition refitting times may be shortened or refitting frequencies may be reduced. In addition, a planning effort for refitting may be reduced.

In an embodiment, the assignment quality is determined on the basis of the number of those orders during the planning interval of which the circuit board types are assigned to the fixed equipment setup family, wherein each order relates to populating a number of circuit boards of a predetermined circuit board type on the populating line. It may thus be provided that the greatest possible variety of orders may be processed by setup of the fixed equipment setup family.

In a further embodiment, the assignment quality is determined on the basis of the total of the circuit boards to be populated within the planning horizon of those circuit board types that are assigned to the fixed equipment setup family. It may thus be provided that the greatest possible number of circuit boards may be populated within the planning horizon, without requiring refitting.

In another embodiment, the assignment quality is determined on the basis of the total of the production times of the circuit boards, the circuit board types of which are assigned to the fixed equipment setup family. It may thus be made possible that the populating line may be operated for the longest possible time within the planning horizon without refitting.

In still another embodiment, the assignment quality is determined on the basis of the total of the populating positions of the circuit boards of the circuit board types that are assigned to the fixed equipment setup family. An improved estimation of the production time of a circuit board may thus be implemented, so that the fixed equipment may be equipped longer without interruption on the populating line.

The assignment quality may be determined in particular on the basis of items of information that are only known approximately. In one embodiment, during the planning horizon, which is six months or more, for example, specific orders for populating circuit boards of a circuit board type are acquired regularly, for example, weekly. Nonetheless, for example, indicators may exist, from historic data, an announcement of a client, or seasonal observation of a sales market for circuit boards, which relate to the entire planning horizon, in particular a number of expected orders or a number of expected circuit boards to be populated of a predetermined circuit board type. The described assignment of the circuit board types to a fixed equipment setup family may be performed on the basis of these indicators, which are only imprecisely known, as described above.

In one embodiment, a plurality of fixed equipment setup families is predefined, to which circuit board types are assigned by the described method. In this case, a global optimization of all predefined fixed equipment setup families may be performed simultaneously.

In an embodiment, the optimization is performed by mixed integer programming. Mixed integer programming represents a global optimization approach, which is easily expandable and for which commercial solution methods or solution devices are available. By mixed integer programming, global maxima may be found in a variety of possible solutions, so that a particularly good optimization may be found. Available methods or devices for mixed integer programming are being continuously improved, so that it is to be expected that in future even better optimization results will become achievable.

The predetermined amount may include a proportion of a difference between the assignment quality and a maximum achievable assignment quality. This difference is also referred to as a "gap". An optimization method may be used in which this "gap" may be determined, in particular, mixed integer programming.

In a further embodiment, the optimization is also aborted if no assignment may be found during a predetermined processing time, the assignment quality of which exceeds the predetermined amount. An excessively large selected predetermined amount for the assignment quality may thus be prevented from precluding the determination of an assignment in a suitable time.

In a further embodiment, the components of the circuit board types of each setup family are assigned to a number of shuttle tables for providing components at the populating line and the assignment of the circuit boards to the setup families is performed under the boundary condition that at least one of the components may only be assigned to a predetermined set of shuttle tables.

In this manner, it may be taken into consideration, for example, that large components or components having rarely used construction forms may only be kept ready on predetermined shuttle tables under certain circumstances.

The assignment of the circuit board types to the setup families may also be performed under the boundary condition that a maximum degree of filling of the shuttle tables is not exceeded. Clearance may thus be left for changes or for mechanical conditions, for example, if components of two arbitrary component types may not be attached in direct proximity on the shuttle table in each case.

In another embodiment, the assignment may be performed under the boundary condition that the circuit board types of a predetermined set are assigned to the same setup family. Thus, for example, circuit boards that are to be populated on their upper side and lower side may be organized in an improved manner.

Alternatively thereto, a boundary condition may also be specified, according to which the circuit board types of a predetermined set are assigned to different setup families.

Thus, for example, processing of the populated components using different solders may be assisted, by which the components are provided.

Furthermore, a computer program product for carrying out the described method on a processing unit and a device for carrying out the assignment are specified.

BRIEF DESCRIPTION OF THE DRAWINGS

The above-described properties, features, and advantages of the embodiments and the manner in which they are achieved will become clearer and more comprehensible in conjunction with the following description of the exemplary embodiments, which are explained in greater detail in conjunction with the drawings.

DETAILED DESCRIPTION

Figure 1:
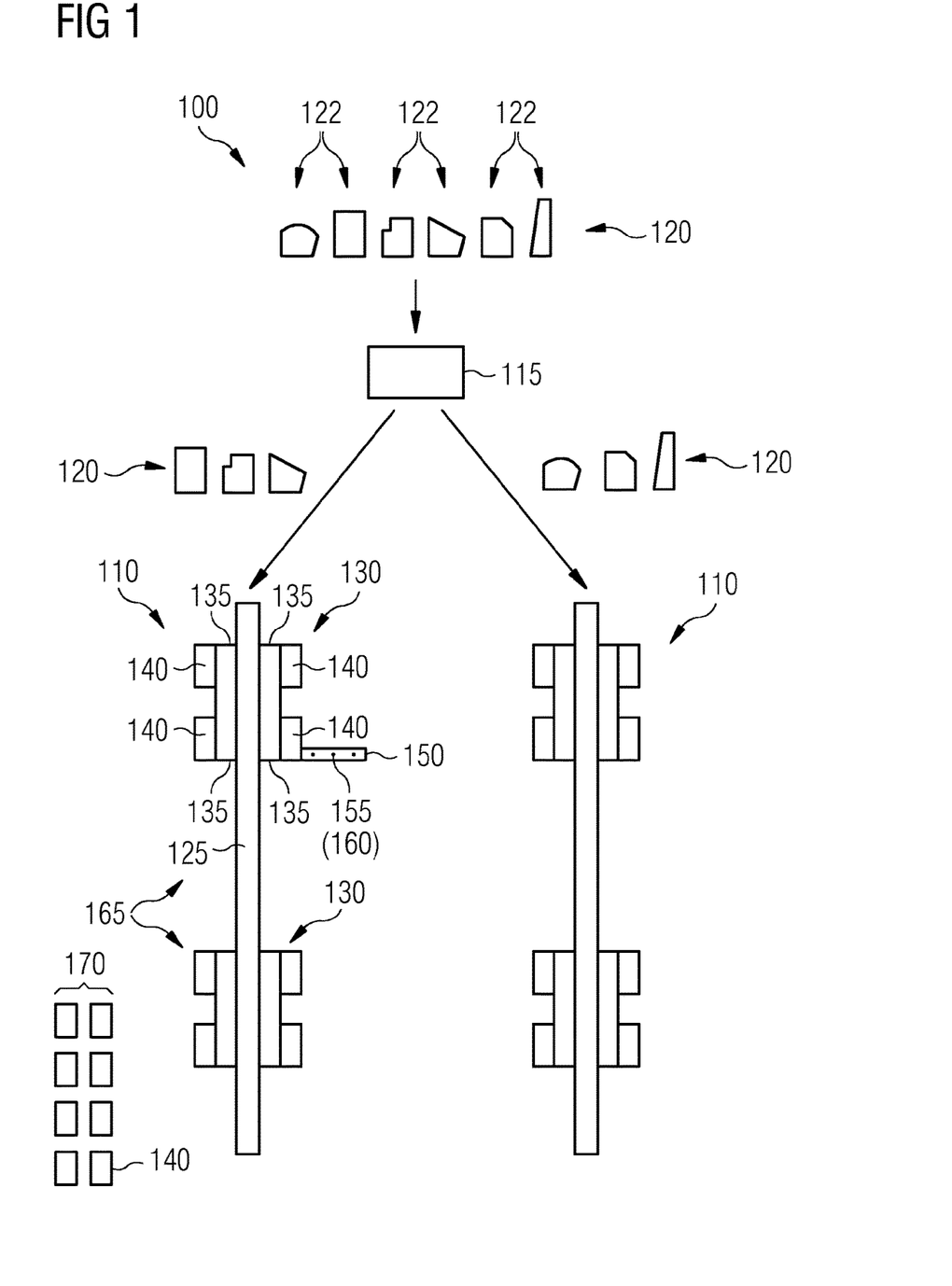
FIG. 1 depicts an example of a populating system.

FIG. 1 depicts a populating system 100. The populating system 100 includes one or more populating lines 110 and a control unit 115. Each populating line 110 includes an optional transport system 125 and one or more populating robots 130. Each populating robot 130 includes one or more populating heads 135, which are each configured to receive components 155 from a shuttle table 140 and position them at a predetermined position on the circuit board 120, which is located on the transport system 125.

During the populating procedure, the circuit board 120 may be stationary in relation to the populating robot 130. The shuttle tables 140 each include a plurality of feed units 150, of which only one is depicted as an example in FIG. 1. Each feed unit 150 keeps ready a supply of components 155 of a predetermined component type 160. For the components 155, the feed unit 150 has a holding capacity, which may be expressed in tracks. Each track may be, for example, 8 mm wide and the number of the tracks of each feed unit 150 is restricted, for example, to 40. Components 155 of the same component type 160 may be provided in a belt, on a tray, or in a tube. Each component type 160 includes a predetermined number of tracks on the feed unit 150, which adjoin one another.

Each feed unit 150 may be configured to keep different components 155 ready and, e.g., different feed units 150 may be attached to one shuttle table 140. If a component 155 of a component type 160, which is not present in one of the shuttle tables 140, is required at the populating robot 130, then one of the attached shuttle tables 140 may not be provided with the required components 155, but rather completely replaced with another, appropriately equipped shuttle table 140. The equipping of a shuttle table 140 to be switched in with components 155 is referred to as preliminary setup and may require a processing time in the range of hours.

Since a change of shuttle tables 140 on the populating line 110 may be linked to a production shutdown, it is desirable to carry out changes of the shuttle tables 140 as rarely as possible.

To populate a predetermined set of circuit boards 120, equipment may be formed, which each include supplies of components 155 of predetermined component types 160, wherein each of the circuit boards 120 of the set may be completely populated with components 155 of the equipment. Equipment may be implemented by a number of shuttle tables 140. In the illustration of FIG. 1, fixed equipment 165 and variant equipment 170 are formed, wherein the shuttle tables 140 of the fixed equipment 165 are attached on the populating line 110 and the shuttle tables 140 of the variant equipment 170 are separated from the manufacturing line 110. One or more items of fixed equipment 165 and one or more items of variant equipment 170 may be provided. A desired case without variant equipment 170 is possible but hardly achievable in practice.

The fixed equipment 165 is configured for the purpose of remaining unchanged with respect to its component types 160, at least during a planning horizon, which may be half a year or a year, for example. Thus, components 155 may be refilled on the shuttle tables 140 of the fixed equipment 165 if needed, but the assignment of component types 160 to tracks of the shuttle tables 140 remains unchanged. If multiple items of fixed equipment 165 are provided, they may thus be exchanged with one another or with one of the items of variant equipment 170 within the planning horizon.

Variant equipment 170, in contrast, is configured to accommodate components 155 of different component types 160 within the planning horizon, but only exists temporarily. For this purpose, the shuttle tables 170, while they are not attached to the populating line 110, may be stripped of components 155 of predetermined component types 160 and equipped with components 155 of other component types 160.

This refitting may include a substantial fraction of manual work and may be time-consuming.

The control unit 115 assigns circuit board types 122, the assigned circuit boards 120 of which are to be populated on the populating line 110, to a setup family. A setup family is a set of circuit board types 122, the circuit boards 120 of which may be completely populated with components 155, which are provided in the assigned equipment 165, 170. A setup family may be assigned to precisely one item of equipment 165, 170 and vice versa.

Figure 2:
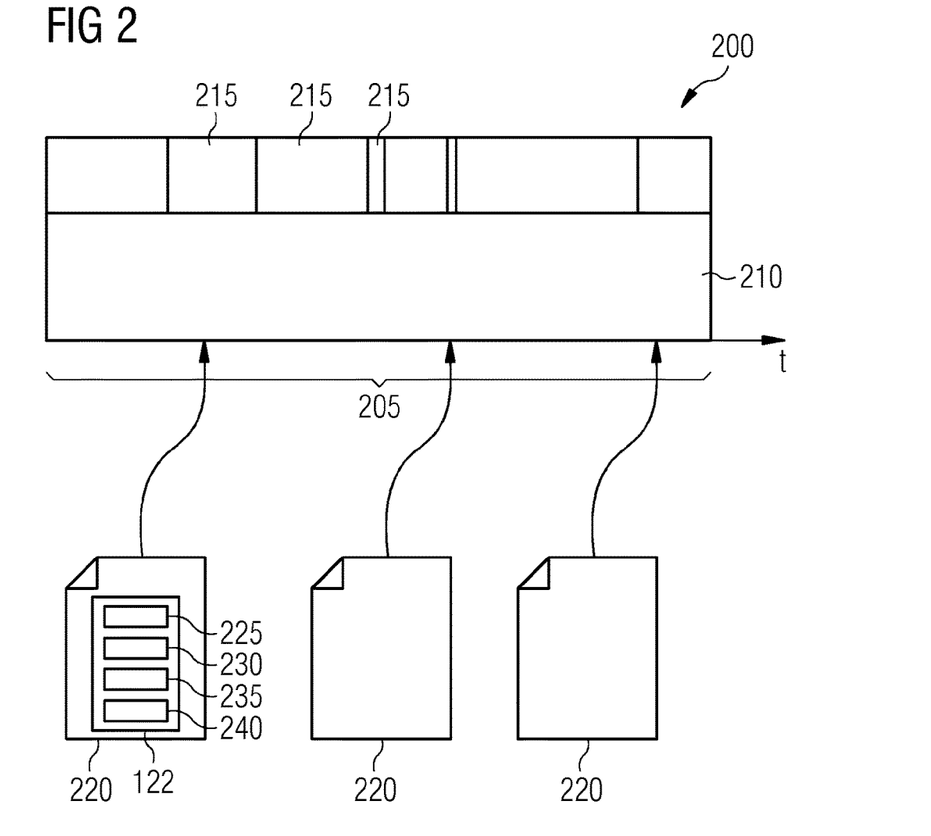
FIG. 2 depicts an illustration of setup families on a populating line from FIG. 1.

FIG. 2 depicts an illustration of setup families at a populating line 110 from FIG. 1. During a planning horizon 210, one fixed equipment setup family 210 and successively different variant manufacturing setup families 215 are equipped on the populating line 110.

The planning horizon 205 may include a longer period of time, for example, approximately 6 to 12 months. During the planning horizon 205, orders 220 arrive regularly or irregularly, which relate to short-term populating of circuit boards 120 with components 155. Each order 220 includes at least the circuit board type 122 and a piece count 225 of circuit boards 120 to be populated.

Further items of information may be assigned to the circuit board type 122. For example, a number 230 of component types 235, which are to be populated on each circuit board 120, a number 235 of populating positions of a circuit board 120, or a production time 240 for a circuit board 120, in each case of the circuit board type 122, may be specified. The number of the populating positions corresponds to the number of the components 155 to be populated on a circuit board 120 of the circuit board type 122, no matter of what component type 160.

An assignment of the circuit board types 122 to the setup families 210 and 215 is frequently carried out when the specific order or orders 220 are already present. In the present case, it is proposed that knowledge about future orders 220, which are expected within the planning horizon 205, but have not necessarily been received yet, also be incorporated in the assignment. This knowledge relates in this case, for example, to experiential values from previous orders 220 or additional items of information that are provided by a customer, for example. Due to the consideration of these items of information, the fixed equipment setup family 210 may be enlarged, so that fewer or less complex setup changes are to be expected during the planning horizon.

In particular, it is desirable to assign those circuit board types 122 to the fixed equipment setup family 210, the assigned orders 220 of which occur frequently, whose total piece count of circuit boards 120 to be populated during the planning horizon 205 is large, or which utilize the populating line 110 to capacity for a long time over the planning horizon 205.

Figure 3:
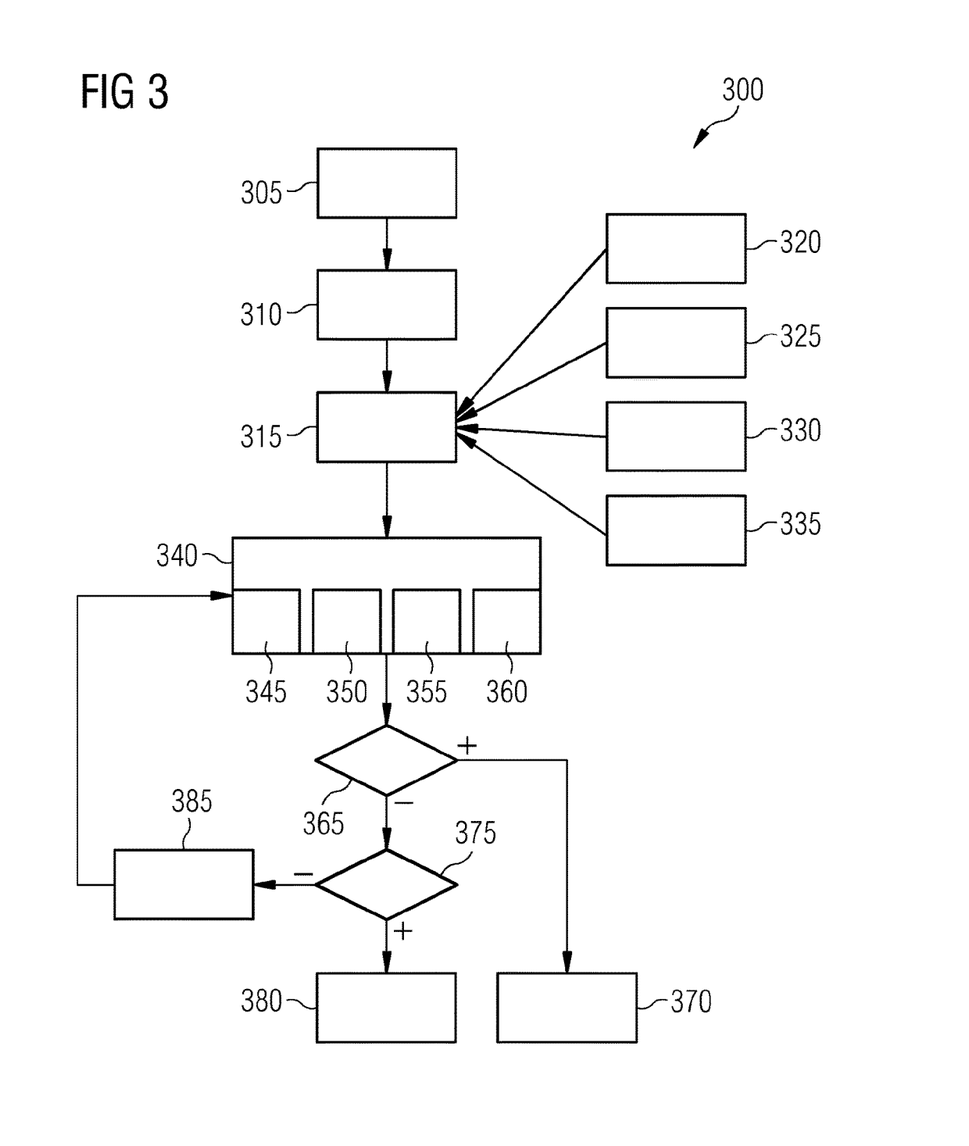
FIG. 3 depicts a flow chart example of a method for assigning circuit boards to setup families.

FIG. 3 depicts a flow chart of a method 300 for assigning circuit boards 120 to setup families 210 or 215, corresponding to the statements on FIGS. 1 and 2.

In act 305, the number of the fixed equipment setup families 210 may be predefined. This number is at least one and may also assume other values, for example, in dependence on provided shuttle tables 140.

In act 310, items of information about orders 220 to be expected in the planning horizon 205 are acquired. These items of information may be of a summary nature in particular and may relate, for example, to a number of orders 220 within the planning horizon 220 or a number of circuit boards 120 to be populated of a predetermined circuit board type 122 within the planning horizon 220. These items of information may be acquired in particular on the basis of historic data or another heuristic. During the acquisition of these items of information, concrete orders 220, which will only become current later in the planning horizon 205, may also be taken into consideration.

In act 315, a starting solution of an assignment of the circuit board types 122 to one or more fixed equipment setup families 210 is determined. During the formation of the starting solution, those circuit board types 122 are determined, which are assigned to the fixed equipment setup family or families 210. An assignment of the remaining circuit board types 122 to a variant manufacturing setup family 215 does not yet have to be performed in this case.

In act 320, during the assignment in act 315, various boundary conditions may additionally be taken into consideration. For example, in act 320, an assignment between a component type 122 and a predetermined shuttle table 140 may be taken into consideration.

In act 325, alternatively or additionally, a maximum degree of filling of one of the shuttle tables 140 or a maximum degree of filling of all shuttle tables 140 of the populating line 110 may be considered.

In act 330, the assignment may also alternatively or additionally be performed under the boundary condition that the circuit board types 122 of a predetermined set are assigned to the same setup family. Thus, for example, circuit boards 120 that are to be populated on their upper side and lower side may be organized in an improved manner.

In act 335, in a corresponding manner, circuit board types 122 of a further predetermined set may be assigned to different setup families. For example, processing of the circuit boards 120 with different solders may thus be assisted, with which the components 155 of a circuit board 120 are provided, to be permanently soldered on the circuit board 120 in a following method, for example, in a reflow oven.

In act 340, an assignment quality of the assignment carried out in act 315 is determined on the basis of the items of information acquired in act 310 and optionally the orders 220 acquired in act 305. Different procedures are possible for determining the assignment quality, which are also combinable with one another. One or more indicators may be determined, on which the assignment quality is based. On the basis of each indicator, which is determined in following acts 345 to 360, an assignment quality may be determined and the individual assignment qualities may be combined to form an overall assignment quality by a weighted total.

In act 345, in a first procedure, a number of orders 220 in the planning interval 205 is determined, the circuit board types 122 of which are assigned to the fixed equipment setup family 210. The assignment quality is subsequently determined on the basis of the determined number.

In act 350, in a second procedure, a number of circuit boards 120 in the planning interval 205 is determined, the assigned circuit board types 122 of which are assigned to the fixed equipment setup family 210. The assignment quality is then determined on the basis of the determined number.

In act 355, in a third procedure, the total of the production times of those circuit boards 120 in the planning interval 205 is determined, the circuit board types 122 of which are assigned to the fixed equipment setup family 210. The assignment quality is then determined on the basis of the determined total.

In act 360, in a fourth procedure, the total of the populating positions 235 of the circuit boards 120 of all orders, the circuit board types 122 of which are assigned to the fixed equipment setup family 210, is determined. The assignment quality is then determined on the basis of the determined total.

In act 365, the determined assignment quality is compared to a predetermined amount. The predetermined amount may be specified absolutely, for example, in the form of a count, a number, or a time. The amount may also be specified relatively, for example, in the form of a ratio of multiple such specifications. In one embodiment, the predetermined amount is specified on the basis of a maximum achievable assignment quality. For example, the predetermined amount may relate to 95% of the maximum achievable assignment quality.

In act 370, if the comparison of act 355 has a positive result, the determined assignment is thus output. Circuit board types 122, which are not yet assigned to a fixed equipment setup family 210 at this point, may then be allocated to one or more variant manufacturing setup families 215 in a separate method.

In act 375, if the comparison in act 355 has a negative result, (thus, if the determined assignment quality is less than the predetermined amount), it may thus be checked in this optional act whether a predetermined processing time for the passage of the method 300 has already passed.

In act 380, if this is the case, the method 300 is thus aborted in act 370.

In act 385, otherwise, the determined assignment is optimized with respect to the assignment quality. The method 300 then continues with act 340.

Acts 315-385 may be performed by solving a mixed integer program. Optimizers based on mixed integer programs are available as commercial products.

In another embodiment, during each passage through the mentioned acts, the best heretofore determined assignment is varied pseudo-randomly or according to a heuristic, so that changed assignments result, from which the best is selected.

Mathematical Background

Due to the use of mathematical methods, improved solutions may be achieved for the assignment of circuit board types 122 to a fixed equipment setup family 210 than using procedures previously used in practice.

An automatic optimization may be used to determine an optimized assignment of circuit board types 122 to a fixed equipment setup family 210. In this case, arbitrary optimization methods may be used, for example, on the basis of local search methods or meta-heuristic algorithms.

An IP model (integer programming or integer program or mixed integer optimization model) may be used. One of the main methods in the field of mathematical optimization is linear optimization, which is concerned with the optimization of linear target functions over a set, which is restricted by linear equations and inequalities. Linear optimization is the foundation of the solution methods of (e.g., mixed) integer linear optimization.

Advantages of linear optimization include (1) a global optimization approach; (2) an easily expandable process; (3) very good commercial standard solvers (e.g., SCIP, CPLEX, Ilog, Xpress), which are widely distributed and proven in practice; and (4) it is known for an ascertained solution how remote it is at most from the optimum solution (gap).

Examples of IP formulations for optimizing the described assignment of circuit board types 122 to a fixed equipment setup family 210 are provided hereafter.

Indices

C set of the component types 155

R set of the circuit boards 120

$R_c$ set of the circuit boards having component type c

F set of the fixed equipment setup families 210

Parameters $Width_c$ space consumption of a component type c in tracks $Cap_{cl}$ number of the tracks of the component types which have space in the equipment of the fixed equipment family cl $Order_r$ number of the orders for the assembly r Binary Variables $Assign_{r,cl}$ has the value 1, if a circuit board type r is assigned to the fixed equipment family cl, otherwise has the value 0

$Setup_{c,cl}$ has the value 1 if the component type c is equipped in the equipment of the fixed equipment family cl, otherwise has the value 0

IP Formulation

The optimization may be performed with respect to the number of the orders for populating circuit board types 122:

$$\text{maximize} \sum_{r \in R} \sum_{cl \in F} Order_r Assign_{r,cl}$$

wherein, s.t.:

$$\sum_{cl \in F} Assign_{r,cl} \leq 1 \qquad r \in R$$

$$\sum_{r \in R} Assign_{r,cl} \leq |R_c| Setup_{c,cl} \quad c \in C; cl \in F$$

$$\sum_{c \in C} Width_c Setup_{c,cl} \leq Cap_{cl} \qquad cl \in F$$

$$Setup_{c,cl} \in \{0, 1\} \qquad c \in C; cl \in F$$

$$Assign_{r,cl} \in \{0, 1\} \qquad r \in R; cl \in F$$

An optimization may also be determined with respect to the total of the circuit boards to be populated. The IP condition then reads:

$$\text{maximize} \sum_{r \in R} \sum_{cl \in F} NumberCircuitboards_r Assign_{r,cl}$$

wherein NumberCircuitboardsr=number of the circuit boards to be populated of the type r in the planning horizon.

Furthermore, an optimization may be determined with respect to the production times of the circuit boards to be populated:

$$\text{maximize} \sum_{r \in R} \sum_{cl \in F} ProdTime_r Assign_{r,cl}$$

wherein $ProdTime_r$=total of the production times of the circuit boards of the type r in the planning horizon.

Furthermore, the assignment quality may be determined on the basis of the production times of the circuit boards to be populated:

$$\text{maximize} \sum_{r \in R} \sum_{cl \in F} BPos_r Assign_{r,cl}$$

wherein $BPos_r$=total of the total of the populating positions of the circuit boards of the type r in the planning horizon.

In one variant, the total assignment quality may also be determined on the basis of a weighted total of multiple ones of the above-mentioned assignment qualities.

To improve the assignment of circuit board types 122 to the fixed equipment setup family 210, further conditions may be specified to the solver, which are specified in greater detail above with reference to acts 320 to 335.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for populating circuit boards on a populating line of a populating system, the method comprising:
   providing the populating system having the populating line, a plurality of shuttle tables, a control unit, a mixed integer program, fixed equipment, and variant equipment, wherein the populating line comprises at least one populating robot, and wherein the fixed equipment and the variant equipment comprise components sufficient to populate a setup family of circuit board types;
   acquiring from production orders circuit board types having circuit boards assigned to each circuit board type to be populated on the populating line within a planning horizon;
   assigning the circuit boards to the setup family by the control unit;
   determining an assignment quality from the production orders, wherein each production order of the production orders comprises a set of circuit boards of the setup family;
   optimizing the assignment of the circuit board types to the setup family by the mixed integer program until the assignment quality exceeds a predetermined assignment quality amount;
   attaching the fixed equipment to the populating line by the plurality of shuttle tables for an entirety of the planning horizon, wherein the fixed equipment is configured to be implemented multiple times on the populating line;
   temporarily attaching and removing the variant equipment from the populating line during the planning horizon; and
   populating the circuit boards on the populating line with the components from the plurality of shuttle tables by the at least one populating robot based on the optimizing of the assignment of the circuit board types.

2. The method as claimed in claim 1, further comprising:
   determining the assignment quality from a total of the circuit boards to be populated within the planning horizon of circuit board types assigned to the fixed equipment.

3. The method as claimed in claim 1, further comprising:
   determining the assignment quality from a total of the production times of the circuit boards to be populated within the planning horizon of circuit board types assigned to the fixed equipment.

4. The method as claimed in claim 1, further comprising:
   determining the assignment quality from a total of the populating positions of the circuit boards of circuit board types assigned to the fixed equipment.

5. The method as claimed in claim 1, further comprising:
   predefining a plurality of setup families.

6. The method as claimed in claim 5, wherein the predetermined assignment quality amount comprises a proportion of a difference between the assignment quality and a maximum achievable assignment quality.

7. The method as claimed in claim 5, further comprising:
   assigning the components of the circuit board types of each setup family to the plurality of shuttle tables for providing the components at the populating line by the control unit under a boundary condition that at least one of the components is only assigned to a predetermined set of shuttle tables.

8. The method as claimed in claim 5, further comprising:
   assigning the components of the circuit board types of each setup family to the plurality of shuttle tables for providing the components on the populating line by the control unit under a boundary condition that a maximum degree of filling of the plurality of shuttle tables is not exceeded.

9. The method as claimed in claim 1, wherein the predetermined assignment quality amount comprises a proportion of a difference between the assignment quality and a maximum achievable assignment quality.

10. The method as claimed in claim 1, further comprising:
    assigning the components of the circuit board types of each setup family to the plurality of shuttle tables for providing the components at the populating line by the control unit under a boundary condition that at least one component of the components is only assigned to a predetermined set of shuttle tables.

11. The method as claimed in claim 1, further comprising: assigning the components of the circuit board types of each setup family to the plurality of shuttle tables for providing the components on the populating line by the control unit under a boundary condition that a maximum degree of filling of the plurality of shuttle tables is not exceeded.

* * * * *